United States Patent [19]

Hirai et al.

[11] Patent Number: 5,485,020

[45] Date of Patent: Jan. 16, 1996

[54] SEMICONDUCTOR DEVICE INCLUDING A THIN FILM TRANSISTOR AND A WIRING PORTION HAVING THE SAME LAYERED STRUCTURE AS AND BEING INTEGRAL WITH A SOURCE REGION OR DRAIN REGION OF THE TRANSISTOR

[75] Inventors: Yutaka Hirai, Tokyo; Yoshiyuki Osada, Yokosuka; Takashi Nakagiri, Tokyo; Katsunori Hatanaka, Yokohama, all of Japan

[73] Assignee: Canon Kabushiki Kaisha, Tokyo, Japan

[21] Appl. No.: 286,989

[22] Filed: Aug. 8, 1994

Related U.S. Application Data

[63] Continuation of Ser. No. 996,878, Dec. 23, 1992, abandoned, which is a continuation of Ser. No. 700,948, May 14, 1991, abandoned, which is a continuation of Ser. No. 287,637, Dec. 21, 1988, abandoned, which is a continuation of Ser. No. 139,095, Dec. 24, 1987, abandoned, which is a continuation of Ser. No. 4,268, Jan. 6, 1987, abandoned, which is a continuation of Ser. No. 589,463, Mar. 14, 1984, abandoned.

[30] Foreign Application Priority Data

Mar. 15, 1983 [JP] Japan ..................... 58-42816
Mar. 15, 1983 [JP] Japan ..................... 58-42817
Mar. 15, 1983 [JP] Japan ..................... 58-42818

[51] Int. Cl.$^6$ ............................ H01L 29/04; H01L 31/20
[52] U.S. Cl. ................... 257/59; 257/61; 257/66; 257/72; 257/350
[58] Field of Search ............................... 357/2, 4, 23.7, 357/59, 71; 354/142; 257/49, 347, 350, 351, 57, 61, 66–72, 74, 75, 59

[56] References Cited

U.S. PATENT DOCUMENTS

| | | | |
|---|---|---|---|
| 3,304,469 | 2/1967 | Weimer | 357/23.7 |
| 3,657,613 | 4/1972 | Brody et al. | |
| 3,749,614 | 7/1973 | Boleky, III et al. | 357/4 |
| 3,806,371 | 4/1974 | Barone | 357/42 |
| 4,047,824 | 11/1977 | Woods | 357/59 |
| 4,119,992 | 10/1978 | Ipri et al. | |
| 4,196,443 | 4/1980 | Dingwall | 357/65 |
| 4,333,099 | 6/1982 | Tanguay et al. | |
| 4,336,550 | 6/1982 | Medwin | 357/39 |
| 4,491,856 | 1/1985 | Egawa et al. | 357/59 |
| 4,554,572 | 11/1985 | Chatterjee | 357/23.7 |
| 4,761,058 | 12/1988 | Okubo et al. | 257/71 |
| 4,942,442 | 7/1990 | Konishi et al. | 357/42 |

FOREIGN PATENT DOCUMENTS

| | | |
|---|---|---|
| 0051397 | 5/1982 | European Pat. Off. |
| 0051397 | 12/1982 | European Pat. Off. |
| 56-56675 | 5/1981 | Japan ............... 357/4 |
| 56-135968 | 10/1981 | Japan ............... 357/2 |

OTHER PUBLICATIONS

"Thin Film Transistors A New Approach to Microelectronics" by A. C. Tickle John Wiley & Sons, Inc. 1969, pp. 6–9 and 73–79.

IBM Technical Disclosure Bulletin, vol. 17, No. 6, pp. 1831–1833, Nov. 1974.

*Primary Examiner*—J. Carroll
*Attorney, Agent, or Firm*—Fitzpatrick, Cella, Harper & Scinto

[57] ABSTRACT

In a semiconductor device comprising a wiring to be connected to the source region or the drain region of a thin film transistor, at least a portion of the wiring comprising a wiring part having the same cross-sectional structure as said source region or said drain region, and said wiring part being formed continuously with said source region or said drain region simultaneously with the respective end portions of said wiring portions, said source region and said drain region formed in such a manner that the edge thereof is set back from the end of the semiconductor layer constituting the thin film transistor.

35 Claims, 12 Drawing Sheets

SEMICONDUCTOR DEVICE INCLUDING A THIN FILM TRANSISTOR AND A WIRING PORTION HAVING THE SAME LAYERED STRUCTURE AS AND BEING INTEGRAL WITH A SOURCE REGION OR DRAIN REGION OF THE TRANSISTOR

This application is a continuation of application Ser. No. 07/996,878 filed Dec. 23, 1992 which is a continuation of application Ser. No. 07/700,948 filed on May 14, 1991, which is a continuation of application Ser. No. 07/287,637 filed on Dec. 21, 1988, which is a continuation of application Ser. No. 07/139,095 filed on Dec. 24, 1987, which is a continuation of application Ser. No. 07/004,268 filed on Jan. 6, 1987, which is a continuation of application Ser. No. 06/589,463 filed on Mar. 14, 1984 now abandoned.

BACKGROUND OF THE INVENTION

1. Field of the Invention

This invention relates to a semiconductor device prepared by use of a semiconductor layer formed on an insulating substrate.

2. Description of the Prior Art

Thin film semiconductor devices of the prior art having a semiconductor (e.g. silicon) layer provided on an insulating substrate have the advantages of easy isolation (i.e. separation between elements) and small floating capacitance, as compared with devices using a silicon crystal as the substrate.

While the SOS (Silicon on Sapphire) technique has the above-mentioned advantages, there is involved a problem that the product cost is relatively high, because sapphire employed for the substrate is expensive. Further, the preparation of MOS type transistors according to the SOS technique, which employs the silicon planar step of the prior art, poses a problem that no device can be prepared without passing through high temperature steps such as oxidation, diffusion, ion implantation, annealing, etc.

Accordingly, wiring for the electrodes in preparation of the device is generally practiced all on the top part of the insulating layer, after having passed through the high temperature fabrication steps. Further, in the SOS technique, when employing for example a crystalline silicon for the semiconductor layer, unless the semiconductor layer has a layer thickness of about 1µ at least, no satisfactory crystalline silicon film can be obtained on the substrate surface. For this reason, in wiring for electrodes on the top part of the insulating layer, it is required to prevent leaks arising in a thin part of the insulating layer resulting from the level difference between the substrate and the source region or the drain region.

Thus, the insulating layer or the metal film for wiring is required to be made thicker so that no leak or wire disconnection may occur. Instead, it has been also proposed to make the semiconductor layer or other layers tapered in the isolation fabrication step or to carry out partial oxidation, etc. to make the level difference moderate or substantially decrease the level difference. However, use of the latter approach will also lead to the problem that the preparation of the semiconductor device become complicated. Also, when the insulating layer is made thicker than is necessary, there may ensue the problem that it may have sometimes adverse effects on the characteristics of the semiconductor device.

Besides, according to the method of the prior art, wiring is effected on the top part of the element by perforating contact holes through the insulating layer. Since such a method requires specific area for contact holes on the top part of the semiconductor device, there has been the problem that the degree of integration of the semiconductor is somewhat restricted. Further, excessive wiring on the top part of the device will require more fabrication steps for preventing short-circuiting between wirings.

SUMMARY OF THE INVENTION

An object of the present invention is to provide a semiconductor device, which requires no taper structure for the prevention of wire disconnection or leaks through the insulating layer due to the level difference in wiring and can be prepared according to simple steps.

Another object of the present invention is to provide a semiconductor device having a constitution, enabling reduction of the floating capacitance of the circuit as a whole by reducing the number of contact holes and decreasing crossovers of wirings.

Still another object of the present invention is to provide a semiconductor device using a thin film transistor exhibiting good transistor characteristics without distortion, having good frequency characteristics, and being also free from leak.

It is also another object of the present invention to provide a semiconductor device, comprising a wiring to be connected to the source region or the drain region of a thin film transistor, at least a part of which comprises a wiring part having the same cross-sectional structure as said source region or said drain region, and said wiring part being formed continuously with said source region or said drain region simultaneously with the respective end portions of said wiring part, said source region and said drain region formed in such a manner that the edge thereof is set back from the end of the semiconductor layer constituting the thin film transistor.

Still another object of the present invention is to provide a semiconductor device, comprising a wiring to be connected to the source region or the drain region of a thin film transistor, at least a part of which is comprised of a wiring part having the same cross-sectional structure as said source region or said drain region, and said wiring part being formed continuously with said source region or said drain region.

Further, another object of the present invention is to provide a semiconductor device, comprising a source region and a drain region of a thin film transistor having respective end portions formed in such a manner that the edge is set back from the end of the semiconductor layer constituting the thin film transistor.

According to one aspect of the present invention, there is provided a semiconductor device comprising a wiring to be connected to the source region or the drain region of a thin film transistor, at least a part of the wiring comprising a wiring part having the same cross-sectional structure as said source region or said drain region, and said wiring part being formed continuously with said source region or said drain region.

According to another aspect of the present invention, there is provided a semiconductor device comprising a source region and a drain region of a thin film transistor having respective end portions formed in such a manner that the edge thereof is set back from the end of semiconductor layer constituting the thin film transistor.

According to still another aspect of the present invention, there is provided a semiconductor device comprising a wiring to be connected to the source region or the drain region of a thin film transistor, at least a part of the wiring comprising a wiring part having the same cross-sectional structure as said source region or said drain region, and said wiring part being formed continuously with said source region or said drain region simultanously with the respective end portions of said wiring part, said source region and said drain region formed in such a manner that the edge thereof is set back from the end of the semiconductor layer constituting the thin film transistor.

BRIEF DESCRIPTION OF THE DRAWINGS

FIGS. 5A through 5D are schematic sectional views taken along the chain lines A-A', B-B' and C-C' in FIG. 4, respectively;

DETAILED DESCRIPTION OF PREFERRED EMBODIMENTS

Figure 1A:
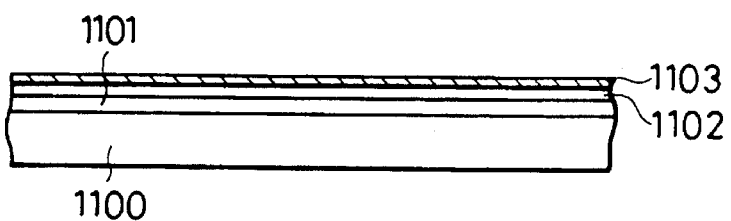
FIGS. 1A through 1F schematic sectional view of the steps for preparation of Example 1 of the present invention.
Figure 1B:
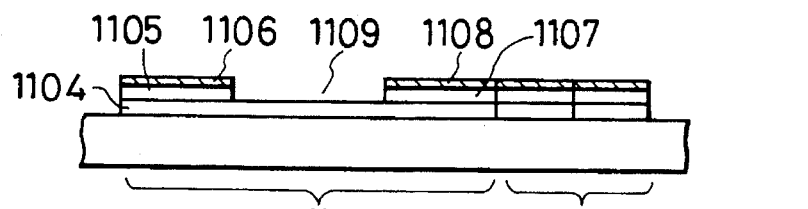
Figure 1C:
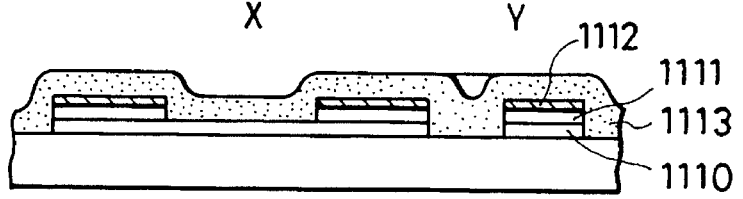
Figure 1D:
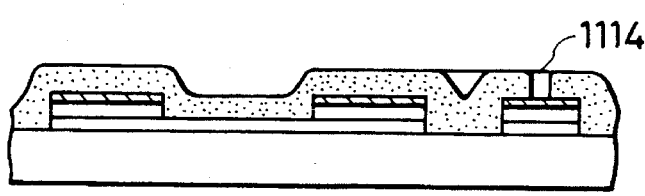
Figure 1E:
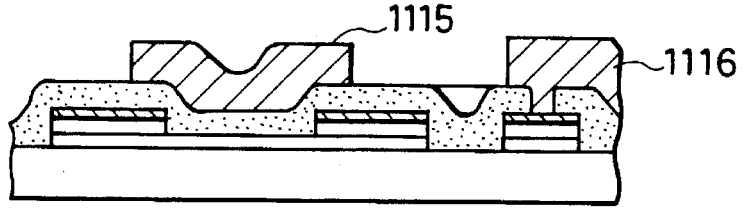
Figure 1F:
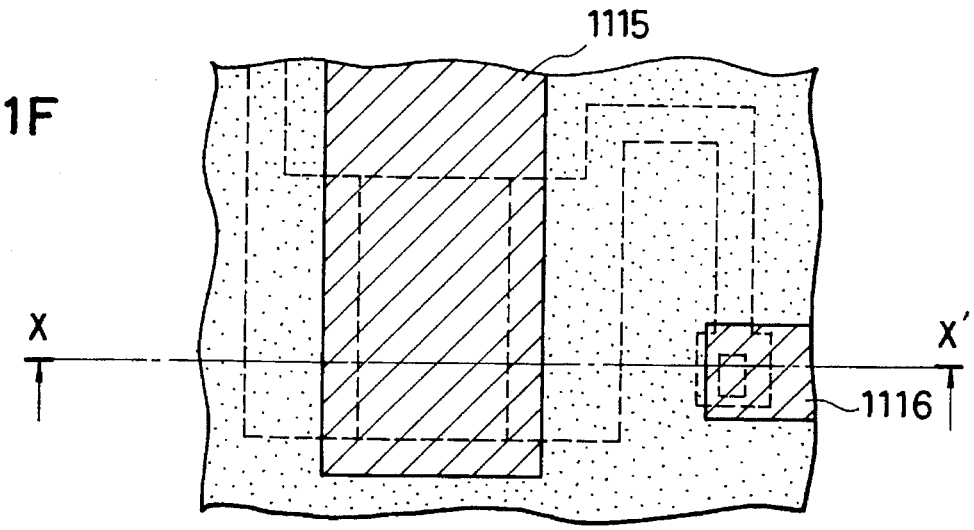

The present invention capable of accomplishing the above objects is described in detail below.

In general, TFT (Thin Film Transistor) has a constitution, which is formed by depositing a semiconductor layer on a substrate, depositing successively an $n^+$ layer (a layer containing an impurity for controlling the semiconductor to n-type) and a metal contact layer on said support (the above $n^+$ layer combined with the metal contact layer is called hereinafter as "the contact layer"), further laminating an insulating layer on the contact layer, followed by provision of gate electrodes and contact holes at required positions for connection to the external wiring to be connected to the source region and the region comprising the contact layer.

In order to accomplish the objects as mentioned above, at least a part of the wiring to be connected to the source region and the drain region in TFT (the part being hereinafter called as "the wiring part") exists between the insulating layer and the semiconductor layer. The configuration of the source region, and the drain region is the same in cross-section as that of the inner wiring part. Alternatively, in the semiconductor device of the present invention, the contact layer is made somewhat smaller than the semiconductor layer by utilizing selective etchability between the contact layer and the semiconductor layer. In other words, the end of the contact layer is formed in such a manner that the edge thereof is set back from the end of the semiconductor layer. With such a construction, the edge from the substrate to the top of the contact layer is divided stepwise into stages. In short while there is no change in the total thickness from the substrate to the upper part of the semiconductor layer and the thickness from the semiconductor layer to the top of the contact layer, due to stepwise division of the level difference into two stages, the level difference for one stage is reduced, whereby the relative level difference may be evaluated to be reduced, as compared with the case where both ends of the contact layer and the semiconductor layer are neatly arranged with each other.

Further, at least a portion of the wiring part is formed between the insulating layer and the semiconductor layer, said wiring part having the same sectional constitution as said source region or drain region, and said wiring part being formed continuously with said source region or said drain region.

Thus, according to the present invention, the leak through cross-over in the TFT portion and the integrated circuit can be reduced, and at the same time, the manufacturing steps of the integrated circuit can be simplified as compared with the method of the prior art wherein the semiconductor layer and other layers are formed with tapering.

By formation of the wiring part between the insulating layer and the semiconductor layer, the semiconductor device can be reduced markedly in number of contact holes, whereby integration of the element can also be effected. Also, according to the present invention, the floating capacitance of the element as a whole can be reduced.

Further, by dividing the level difference into two stages, breaking of the insulating layer will hardly occur and therefore the layer is not required to be so thick. Thus, a semiconductor device having improved actuation characteristics of transistor can be obtained.

In addition, according to the present invention, there can be obtained a semiconductor device with less uneven surface.

That is, according to the present invention, not only the drawbacks of the prior art as described above can be removed, but also a semiconductor device can be prepared easily with good reproducibility.

Further, according to the present invention, there is provided a semiconductor device having a thin film transistor (TFT), which has a construction suitable even for integration.

In the present invention, an insulating substrate is employed as the substrate for the semiconductor device. For example, when a glass is used as the insulating substrate, it is impossible to use the high temperature fabrication steps such as thermal oxidation, diffusion, ion implantation, heat treatment, etc. in preparation of the semiconductor device. Accordingly, when a glass is employed as the substrate, PCVD (Plasma Chemical Vapor Deposition) method, LPCVD (Low Pressure Chemical Vapor Deposition) method or the like may preferably be employed for formation of semiconductor layers. These methods enable the formation of semiconductor layers even at relatively lower substrate temperatures of 800° C. or lower. On the other hand, as the insulating layer, there may preferably be employed an Si—N—H layer, SiO$_2$ layer, Si—N—O layer and the like, which can be formed at lower temperatures. Metal wiring may be conducted according to the methods generally known in the art such as vapor deposition.

The semiconductor layer to be used in the present invention may include polycrystalline, crystalline and non-crystalline semiconductor layers, particularly preferably polycrystalline silicon, crystallized silicon and amorphous silicon. Also, provided that desirable characteristics may be obtained in the semiconductor layer, it is not required to constitute the whole semiconductor layer with polycrystalline silicon, crystallized silicon and amorphous silicon, but they may be used in only a fraction of the semiconductor layer.

[EXAMPLE 1]

Referring now to a preferable example, the present invention is described in more detail.

The steps A through E which are schematic sectional views shown in FIG. 1 are schematic illustrations of the steps for preparing a preferable example of the present invention. The schematic partial plan view F shown in FIG. 1 corresponds to the step E. The illustration of each step shows the views taken along the chain line X–X' in FIG. 1F.

Firstly, an insulating substrate 1100 such as of glass or quartz was polished and cleaned, and then a semiconductor layer 1101 of a polycrystalline silicon was deposited in a thickness of about 2500 Å by means of glow discharge. Next, an n$^+$ layer 1102 (in this Example, a layer containing an impurity for controlling silicon to n-type) with a bulk resistance of 0.1 Ω.cm was deposited in a thickness of about 800 Å by using also the glow discharge method. Further, as the metal layer for contact, for example, aluminum, molybdenum or chromium was vapor deposited [Step A]. As the next step, isolation between the TFT part X and the wiring part Y was effected by dry etching or wet etching, followed by formation of source regions 1105, 1106 and drain regions 1107 and 1108 [Step B]. At this point, the part 1109 became the channel region. Subsequently, an insulating layer 1113 was deposited in a thickness of about 3000 Å [Step C]. Then, a contact hole 1114 was perforated [Step D]. Further, a metal such as aluminum or chromium for an upper electrode 1115 and a lead-out electrode 1116 was vapor deposited and formed into respective electrodes by photoetching [Step E].

According to the above steps, one example having the constitution of the present invention was prepared.

The external wiring lead-out portions 1111 and 1112 at the wiring part Y are formed continuously with the drain regions 1107 and 1108. The wiring part Y is not necessarily required to be formed just beside the TFT as shown in this Figure, but it may be formed at a position suitable for wiring. Also, any wiring may be made through the contact holes as desired, as in the case of connection to external circuits or input and output of signals.

[EXAMPLE 2]

Figure 2:
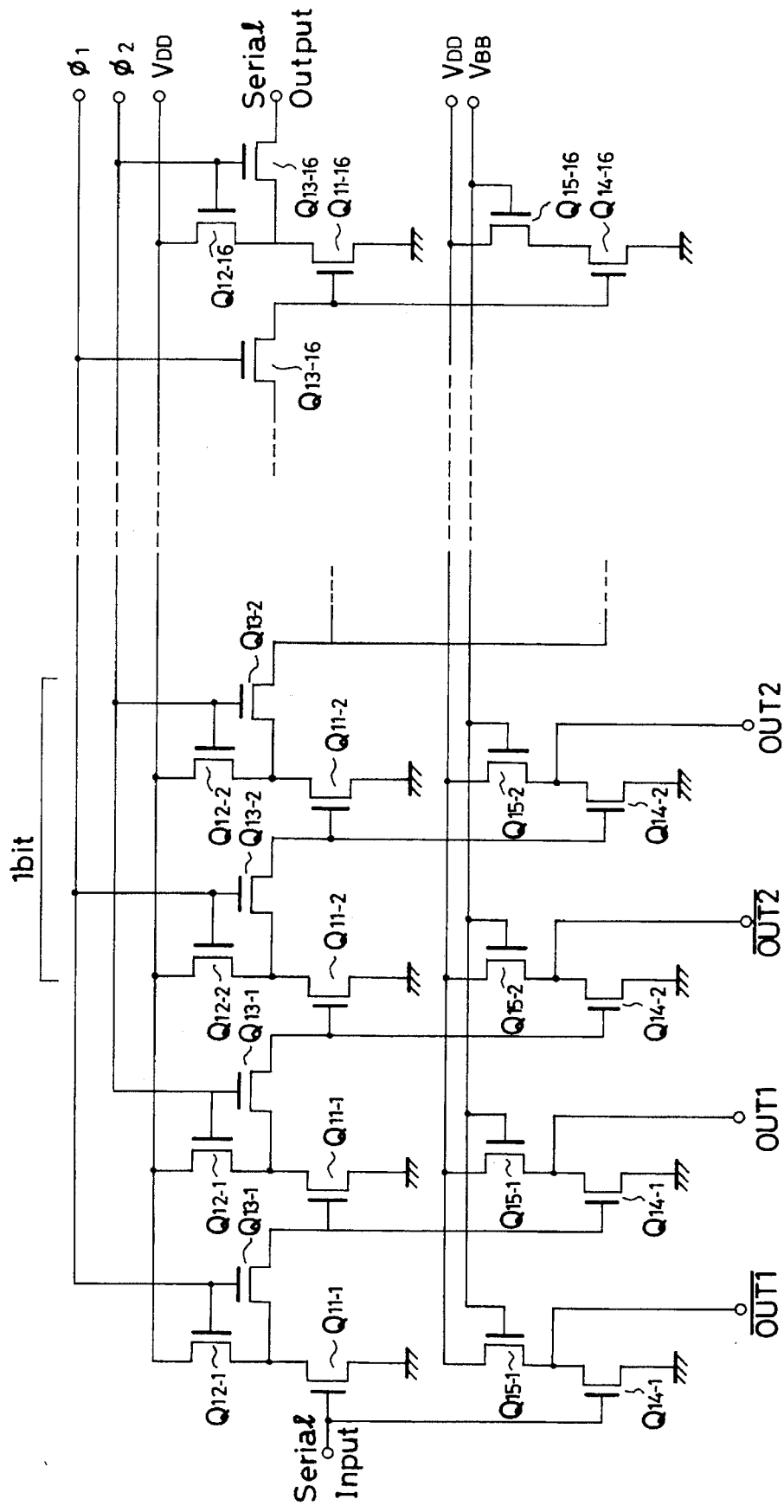
FIG. 2 is a circuit diagram of the 16 bit shift register of Example 2.
Figure 3:
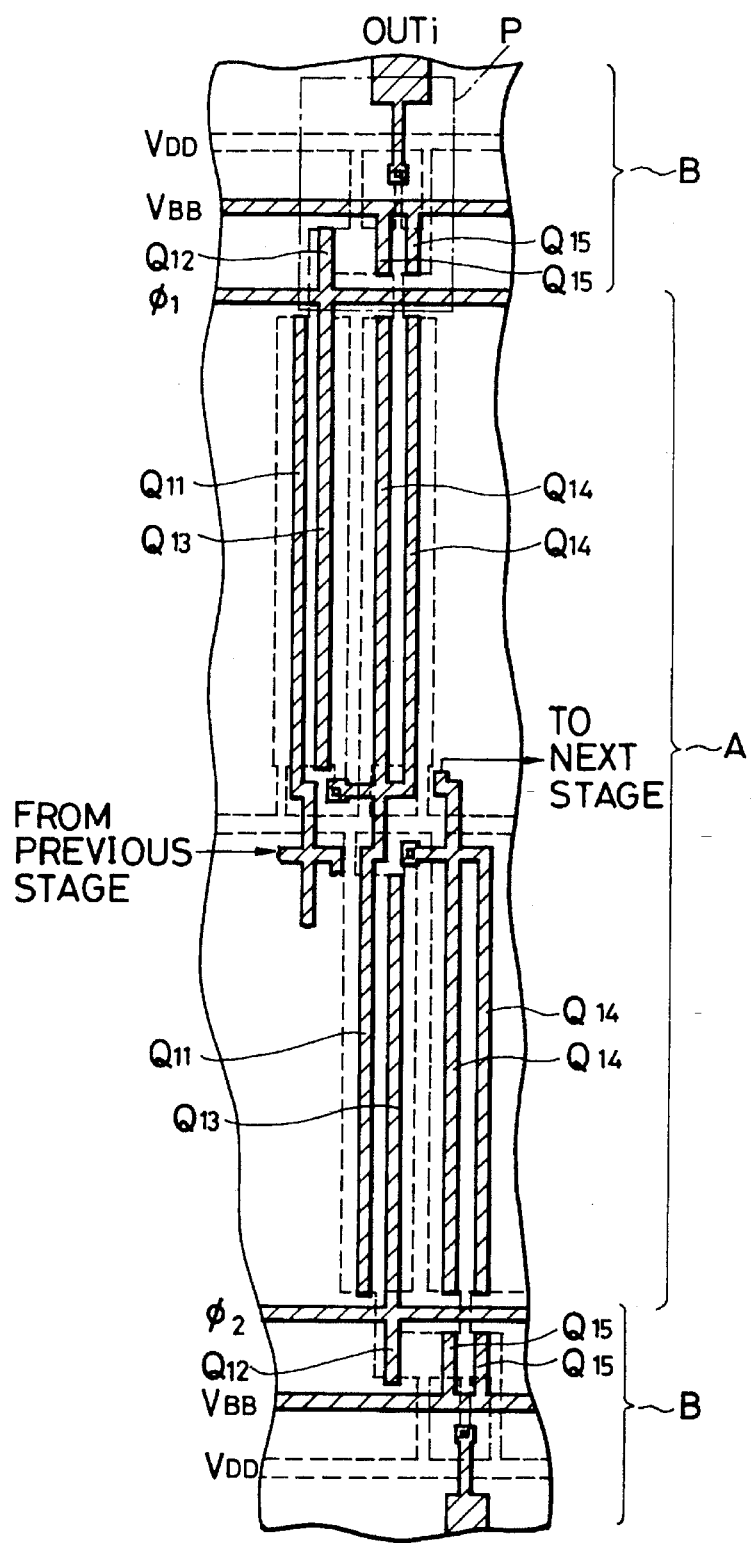
FIG. 3 is a schematic plan view of the wiring of one bit in Example 2.
Figure 4:
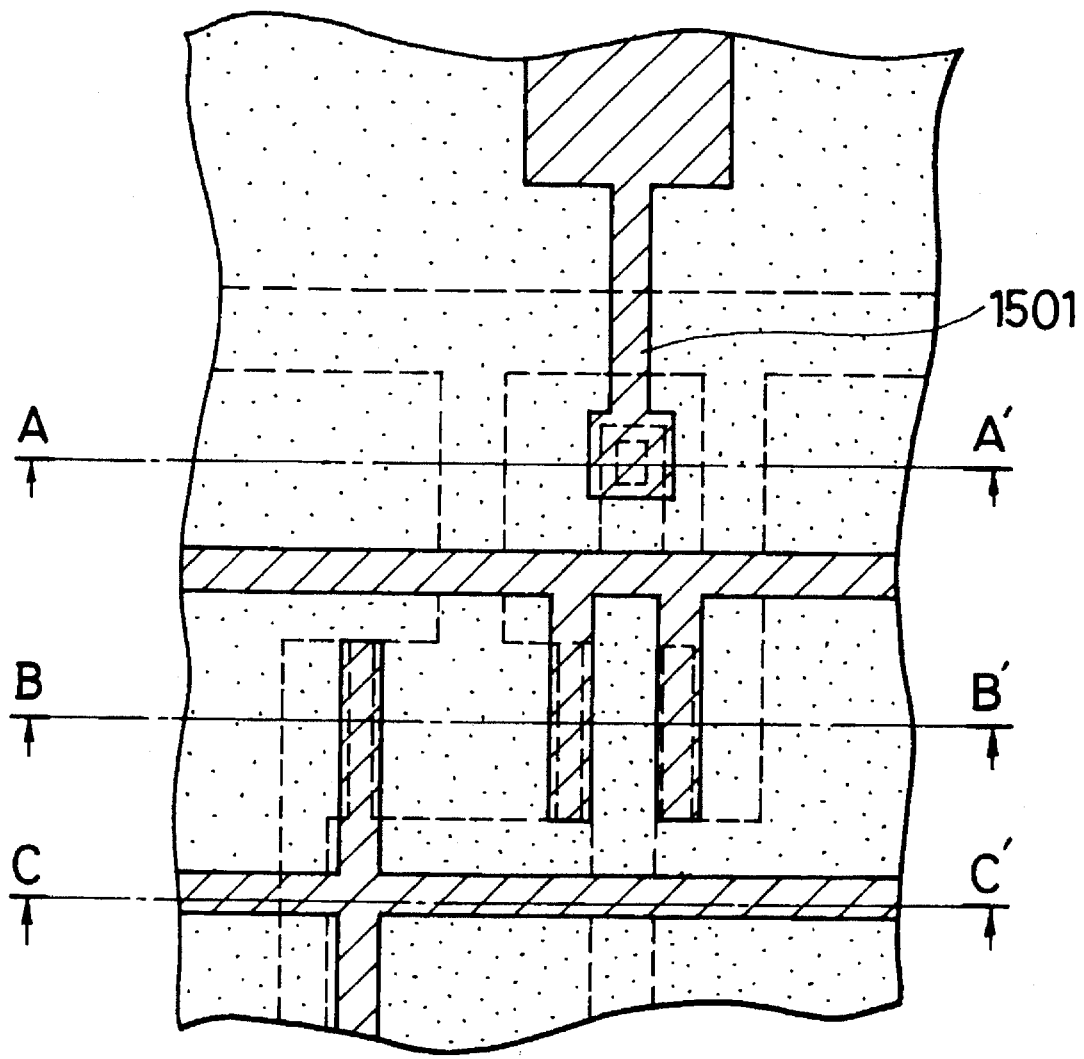
FIG. 4 is a schematic enlarged view of the region P enclosed within the chain line in FIG. 3.

A second example is described by referring to FIG. 2 to FIG. 5C. FIG. 2 is a circuit diagram of the 16 bit shift register of this Example, and FIG. 3 is a schematic plan view of wiring corresponding to one bit in the shift register shown in FIG. 2. FIG. 4 is a schematic enlarged view of the region P enclosed within the broken line shown in FIG. 3. FIG. 5A, B and C are schematic sectional views taken along the chain lines A–A', B–B' and C–C', respectively, shown in FIG. 4.

This example was prepared by depositing a thin film polycrystalline silicon on a glass substrate of Corning #7059 (trade name: produced by Corning Co.), and following otherwise the same steps as the steps A to E shown in FIG. 1.

The part A shown in FIG. 3, namely the driver TFT $Q_{11}$ and transfer gate TFT $Q_{13}$ was made to have a shape as represented by W/L=1500μ/20μ, wherein W is channel width and L is channel length. On the other hand, in the same Figure, the part B, namely the load TFT was made to have a shape of W/L=150μ/20μ. The buffer TFT $Q_{14}$ $Q_{15}$ were made to have W/L of 3000μ/20μ, 300μ/20μ, respectively. Overlapping of gate and source regions and of gate and drain regions were each made 2.5μ.

In FIG. 4 to FIG. 5C, 1501 represents an electrode for lead-out, 1502 a semiconductor layer, 1503 an n$^+$ layer, 1504 a metal contact layer, 1505 an insulating layer, 1506 a gate electrode, and 1507 a metal layer for wiring.

Figure 5A:
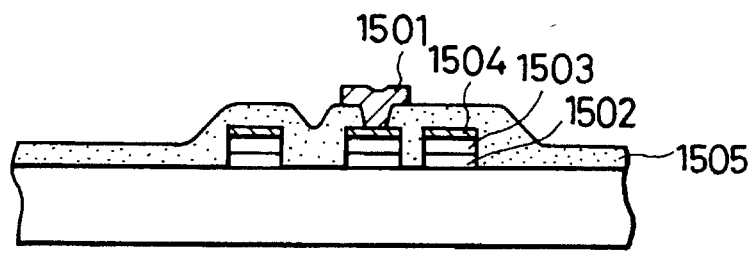
Figure 5B:
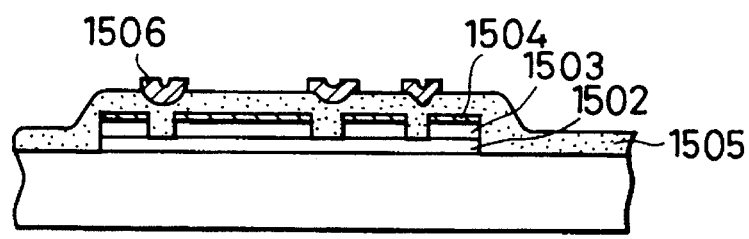
Figure 5C:
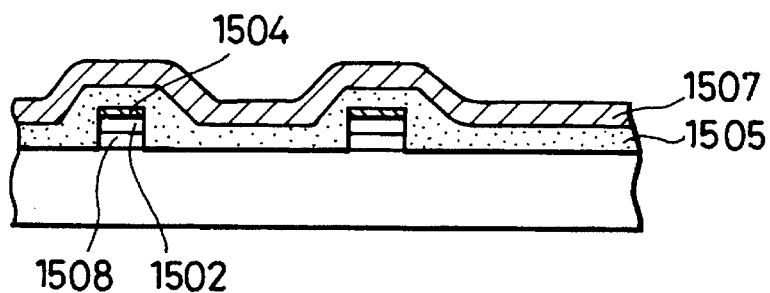
Figure 6A:
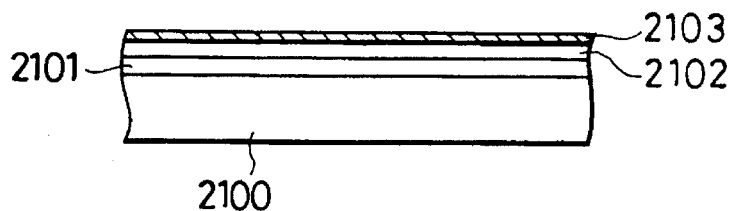
FIGS. 6A through 6E are schematic illustrations of the steps for preparation of Example 3 of the present invention.
Figure 6B:
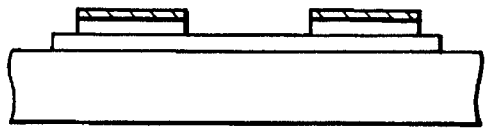
Figure 6C:
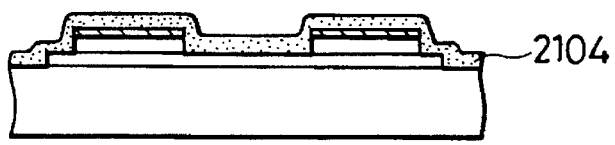
Figure 6D:
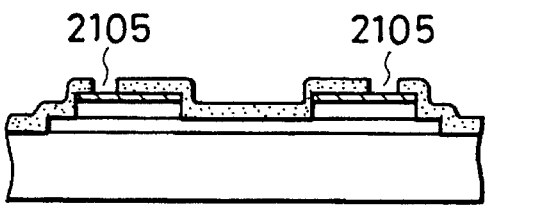
Figure 6E:
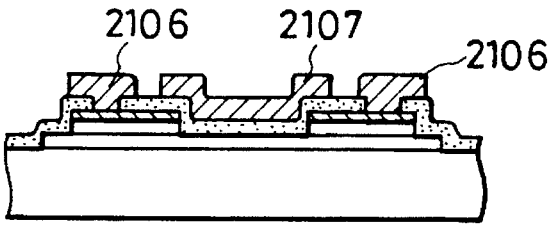

As shown in FIG. 5A and FIG. 5C, in this Example, the source region comprising a semiconductor layer and an n$^+$ layer, and the drain region comprising similarly semiconductor layer and an n$^+$ layer, and further the wiring part comprising similarly a semiconductor layer and an n$^+$ layer are provided between the insulating layer and the substrate. As described above, since the respective regions and the wiring part have the same sectional configuration, there is created no level difference between the respective regions and the wiring part.

Also, in this Example, the electrode wirings formed on the top part of the semiconductor device are only external wiring to be connected to the source region or the drain region and the gate electrode.

In this Example, because the number of cross-overs in the wiring part could be made very small, the floating capacitance of the circuit as a whole could also be suppressed small.

As the result of measurement for the shift register of this Example, the actuation frequency in the case of an effective mobility of electrons of 5 cm$^2$/V.sec in the TFT unit having a constitution of the present invention had a sufficiently high measured value. Thus, it was confirmed that the TFT according to the present invention had satisfactory performance.

[EXAMPLE 3]

Another preferred example of the present invention is described below by referring to the drawing.

The steps A to E which are schematic sectional views are shown in FIG. 6 are schematic illustrations of the preparation steps of another example of the semiconductor device of the present invention.

First, an insulating substrate 2100 such as of glass or quartz was polished and cleaned, and then a semiconductor layer 2101 of a polycrystalline silicon was deposited in a thickness of about 2500 Å by means of glow discharge. Next, an n$^+$ layer 2102 (in this Example, a layer containing an impurity for controlling silicon to n-type) with a bulk resistance of 0.1 Ω.cm was deposited in a thickness of about 800 Å likewise by glow discharge. Further, as the metal layer for contact, a metal conventionally used for semiconductor devices such as aluminum, molybdenum or chromium was vapor deposited [Step A]. As the subsequent step, simultaneously with formation of the source region and the drain region of TFT, isolation thereof from other portions was made [Step B]. At this point, the edge of the source and of the drain regions were formed as being set back from the end of the semiconductor layer 2101. Subsequently, an insulating layer 2104 was deposited to a thickness of about 3000 Å [Step C]. Then, contact hole 2105 was made [Step D]. Further, a metal such as aluminum or chromium for source and drain wiring 2106 and upper gate electrode 2107 was vapor deposited and formed into respective electrodes by photoetching [Step E]. Thus, another example of the present invention was prepared.

In preparation of this Example, it is desirable that the contact layer should be formed in such a manner that the edge thereof is set back from the end of the semiconductor layer by at least a distance which is not less than the thickness of the insulating layer 2104 deposited in the Step D.

Figure 7:
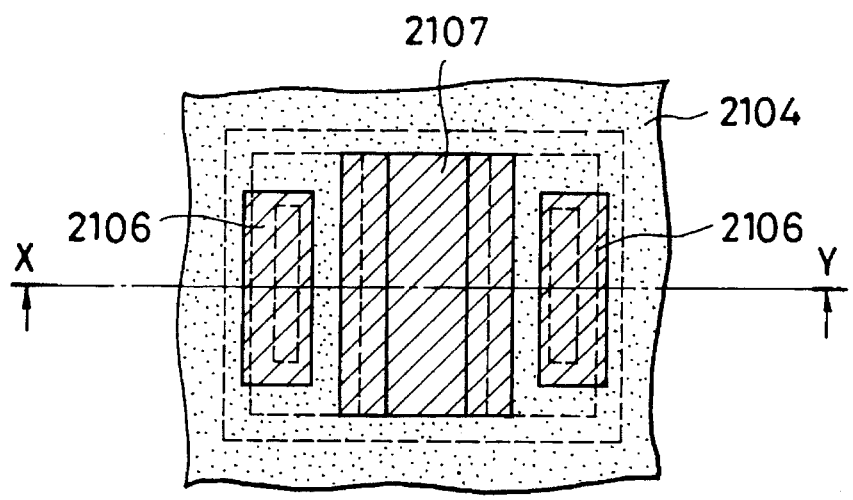
FIG. 7 is a schematic illustration of the steps of FIG. 6 as viewed from the above.

FIG. 7 is a schematic plan view of the semiconductor device in the step E shown in FIG. 6. The respective sectional views shown in FIG. 6 are taken along the chain line X–Y in FIG. 7.

The TFT prepared in this Example is free from breaking of the insulating layer even when the insulating layer may be thin. Also, it was possible to form a TFT without leak or wire disconnection, even when the metal wiring portion was not made so thick. Further, due to thinness of the insulating layer, the TFT obtained had very good characteristics.

[EXAMPLE 4]

Figure 8A:
FIGS. 8A through 8G schematic illustration of the steps for preparation of Example 4 of the present invention, as shown by the sectional views of the steps A through F, FIG. 8G showing a schematic partial plan view of the semiconductor device of Example 4.
Figure 8B:
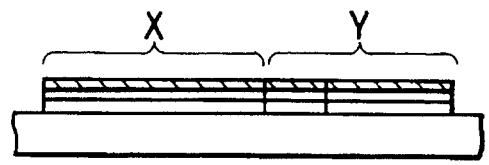
Figure 8C:
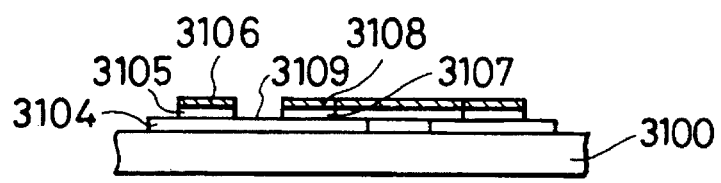
Figure 8D:
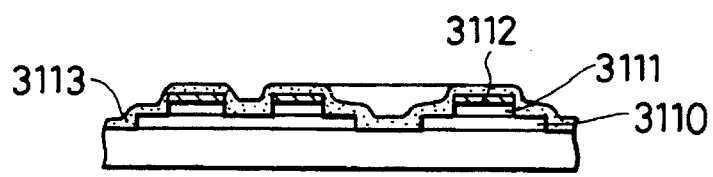
Figure 8E:
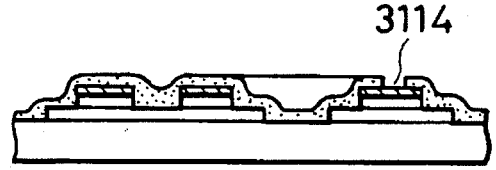
Figure 8F:
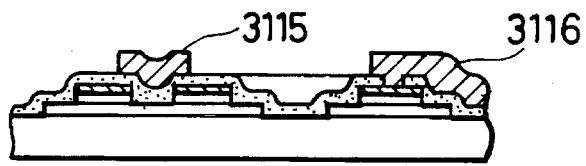
Figure 8G:
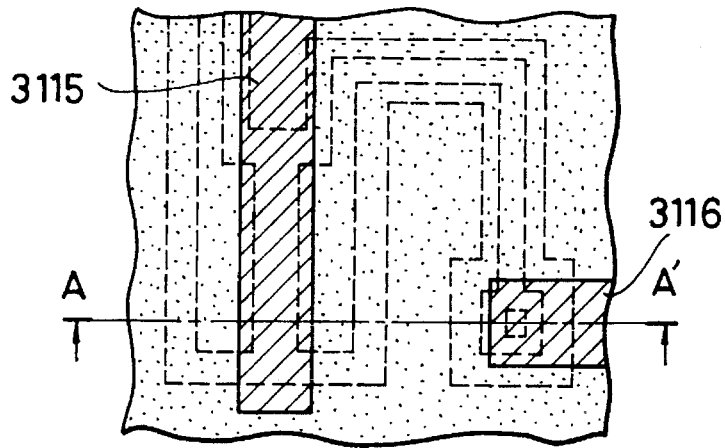

The step FIGS. 8A–F are schematic illustrations of the steps for preparation of another preferable example of the semiconductor device according to the present invention. FIG. 8G shows a schematic plan view of the device, and FIG. 8F is a sectional view taken along the chain line A–A' in FIG. 8G. First, an insulating substrate 3100 such as of glass or quartz was polished and cleaned, and then a semiconductor layer 3101 of a polycrystalline silicon was deposited on said substrate 3100 in a thickness of about 2500 Å by means of glow discharge. Then, an n$^+$ layer 3102 (in this Example, a layer containing an impurity for controlling silicon to n-type) with a bulk resistance of 0.1 Ω.cm was deposited in a thickness of about 800 Å likewise by glow discharge. Further, as the metal layer for contact, a metal conventionally used for semiconductor devices such as aluminum, molybdenum or chromium was vapor deposited [Step A]. As the next step, isolation between the TFT part X and the wiring part Y was effected by dry etching or wet etching [Step B]. Then, source regions 3105, 3106 and drain regions 3107 and 3108 were formed [Step C]. The portion 3109 became the channel region. The area of the contact layer was made considerably smaller than that of the semiconductor layer 3104 for forming transistor. More specifically, the peripheries of the contact layer and the semiconductor layer, namely their edges, were not neatly arranged, but the end of the contact layer was formed in such a manner that the edge thereof is set back from the semiconductor layer by at least the width not smaller than the thickness of the insulating layer formed in the Step D.

Subsequently, an insulating layer 3113 was deposited in a thickness of about 3000 Å [Step D], Then, a contact hole 3114 was made [Step E]. Further, a metal such as aluminum or chromium was vapor deposited as an upper electrode 3115 and a lead-out electrode 3116 and formed into respective electrodes by photoetching [Step F]. Thus, another preferable example (hereinafter called as Example 4) was prepared.

FIG. 8G is a schematic partial plan view of a device of Example 4 prepared according to the steps A through F. FIG. 8F is the sectional view taken along the chain line A–A' in FIG. 8G.

As can be seen from the step F and the plan view G in FIG. 8, the wiring parts connected to the drain regions and the source regions of TFT are all arranged underneath the insulating layer 3113. When those wiring parts to be connected to the gate of TFT or connected to the external circuit or when signals are to be inputted or outputted, or when designing of the circuit requires, wiring contact is made through the contact holes (e.g. the contact hole 3114).

[EXAMPLE 5]

Figure 9:
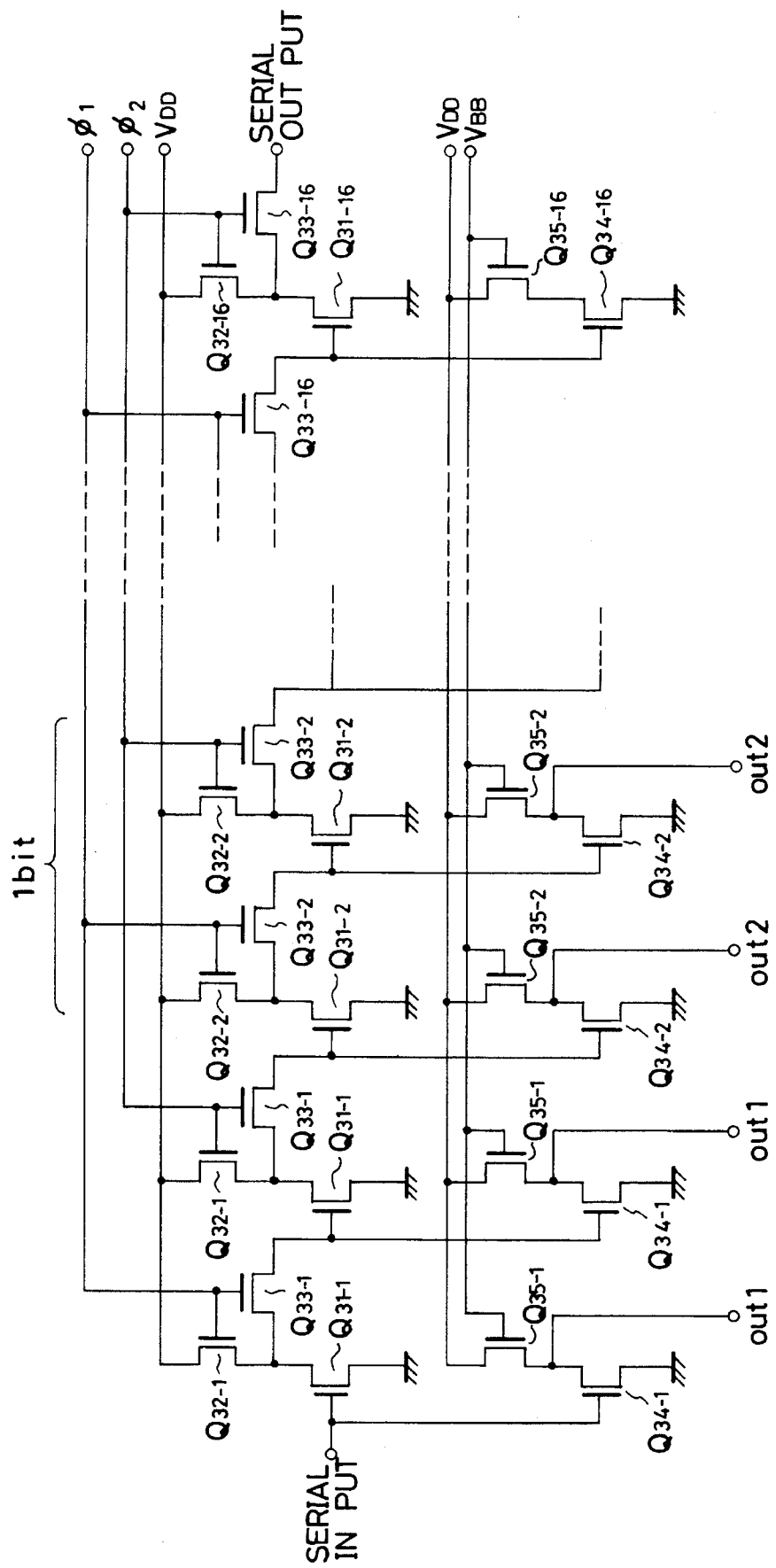
FIG. 9 is a circuit diagram of Example 5.
Figure 10:
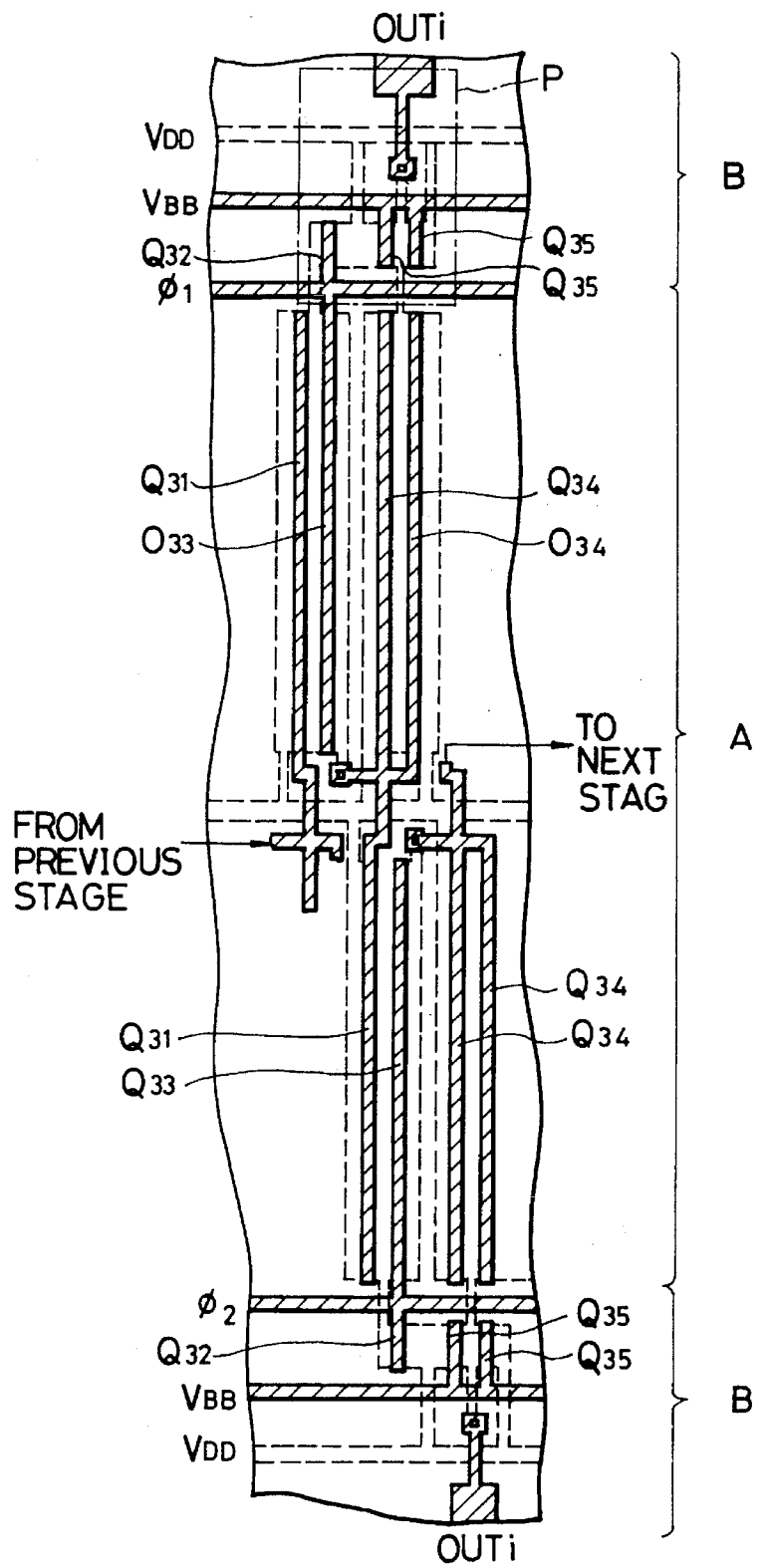
FIG. 10 is a schematic plan view of the wiring of one bit in Example 5 represented by the circuit diagram in FIG. 9.

FIG. 9 and FIG. 10 are a circuit diagram and a schematic plan view of wiring of another preferable example of the present invention, respectively. More particularly, FIG. 9 is a circuit diagram of the 16 bit shift register, and FIG. 10 is a schematic plan view of wiring corresponding to one bit in the shift register shown in FIG. 9.

Figure 11:
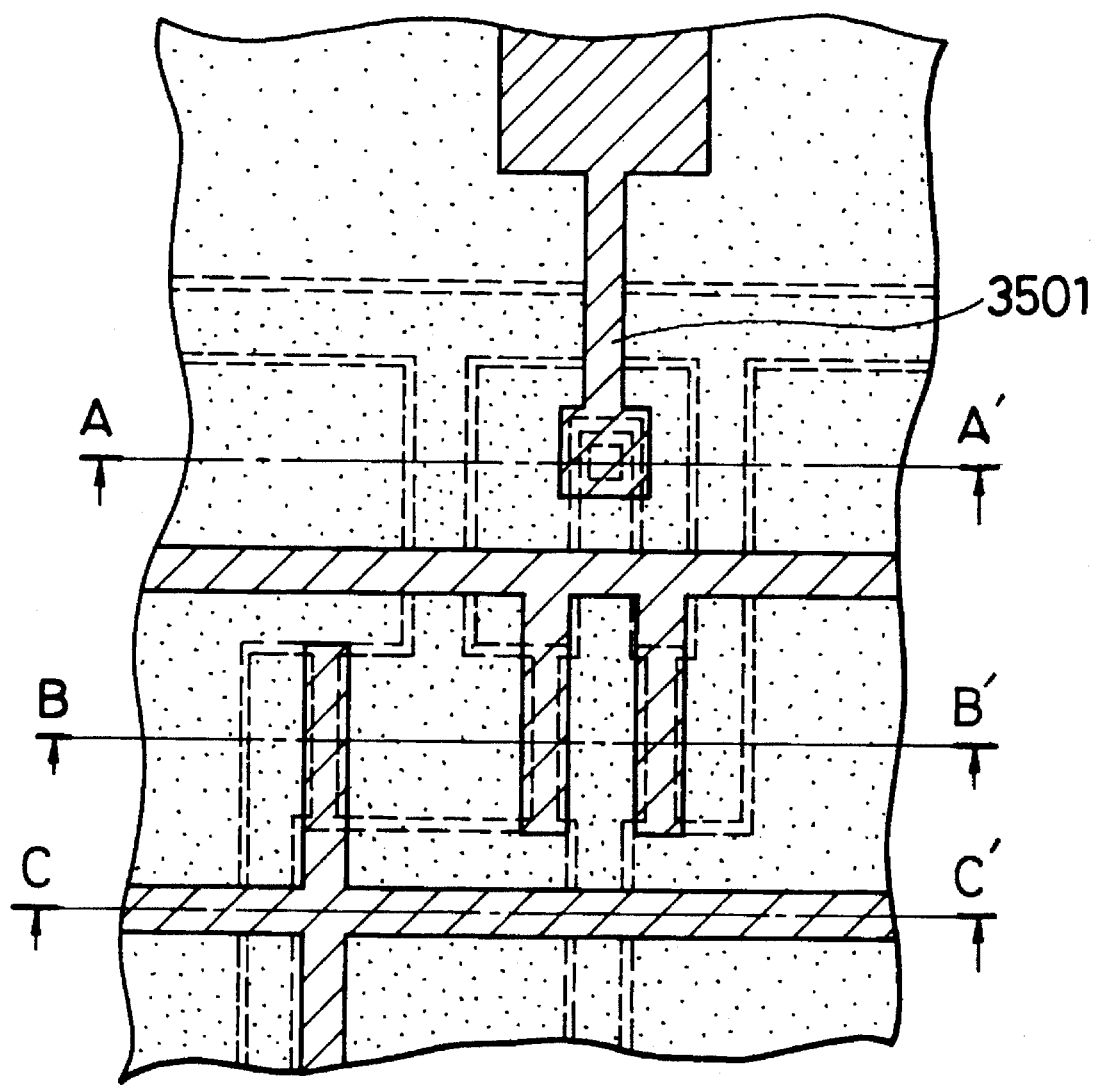
FIG. 11 is an enlarged view of the region P enclosed within chain line shown in FIG. 10.
Figure 12A:
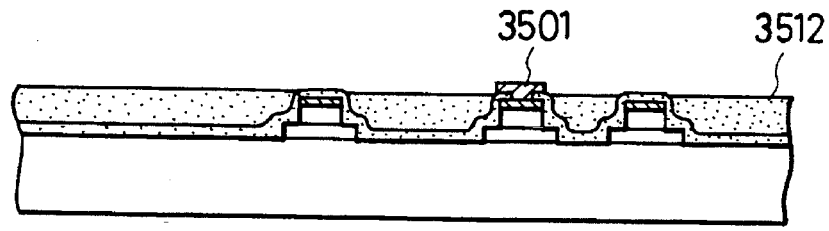
FIGS. 12A through 12C are schematic sectional views taken along the broken lines A-A', B-B' and C-C', respectively, shown in FIG. 11.

FIG. 11 is a schematic enlarged view of the region P enclosed with the broken line shown in FIG. 10. FIG. 12A, B and C are schematic sectional views taken along the chain lines A–A', B–B' and C–C', respectively, shown in FIG. 11.

By using FIG. 9 to FIG. 12C, this Example (hereinafter referred to as Example 5) is explained below.

A device of Example 5 was prepared by depositing a polycrystalline silicon thin film on a glass substrate of Corning #7059 (trade name: produced by Corning Co.), and following otherwise the same steps as the steps A to F shown in FIG. 8.

The part A shown in FIG. 10, namely the driver TFT $Q_{31}$ and transfer gate $Q_{33}$ was made to have a shape as represented by W/L=1500μ/20μ, wherein W is channel width and L is channel length. On the other hand, in the same Figure, the part B, namely the load TFT $Q_{32}$ was made to have a shape of W/L= 150μ/20μ. The buffer TFT $Q_{34}$, $Q_{35}$ were made to have a shape of W/L of 3000μ/20μ, 300μ/20μ, respectively. Overlapping of gate and source regions and of gate and drain regions were each made 2.5μ.

Figure 12B:
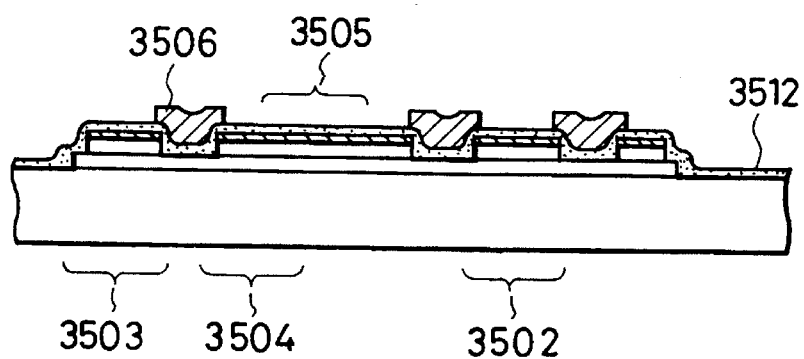

As shown in FIG. 12A and FIG. 12B, not only all of the source region 3503, the drain region 3504 and the wiring part 3505 connected to those region are provided underneath the insulating layer, but also the wiring part has a construction including the n$^+$ layer and the metal contact layer similarly as the cross-sectional structure of the source region 3503 and the drain region 3504. Therefore, there is formed no level difference between the wiring part 3505 and the source region 3503 and the drain region 3504. On the other hand, the upper electrode wiring consists of the electrode lead-out portion 3502 of the source region or the drain region, the gate electrode 3506 and the wiring part connected thereto.

Figure 12C:
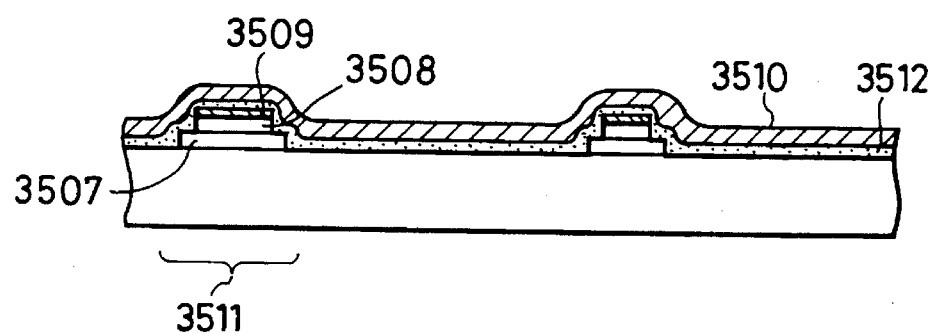

As shown in FIG. 12C, the wiring part 3510 connected to the gate crosses over the wiring part 3511 connected to the source region and the drain region. However, since the wiring part 3511 was formed 2.5μ inner from the edge portion of the semiconductor layer and the insulating layer was 3000 Å thick or more, no abrupt level change was formed, whereby substantially no leak occurred. Further, the number of cross-over at the wiring part could be made very small, and therefore the floating capacitance of the circuit as a whole could be suppressed also very small.

As the result of measurement of the actuating frequency of the shift register of this Example, when the TFT unit having the constitution of the present invention has an effective mobility of 5 cm$^2$/V.sec, the actuating frequency was found to be 240 KHz, indicating sufficient performance.

[EXAMPLE 6]

Figure 13:
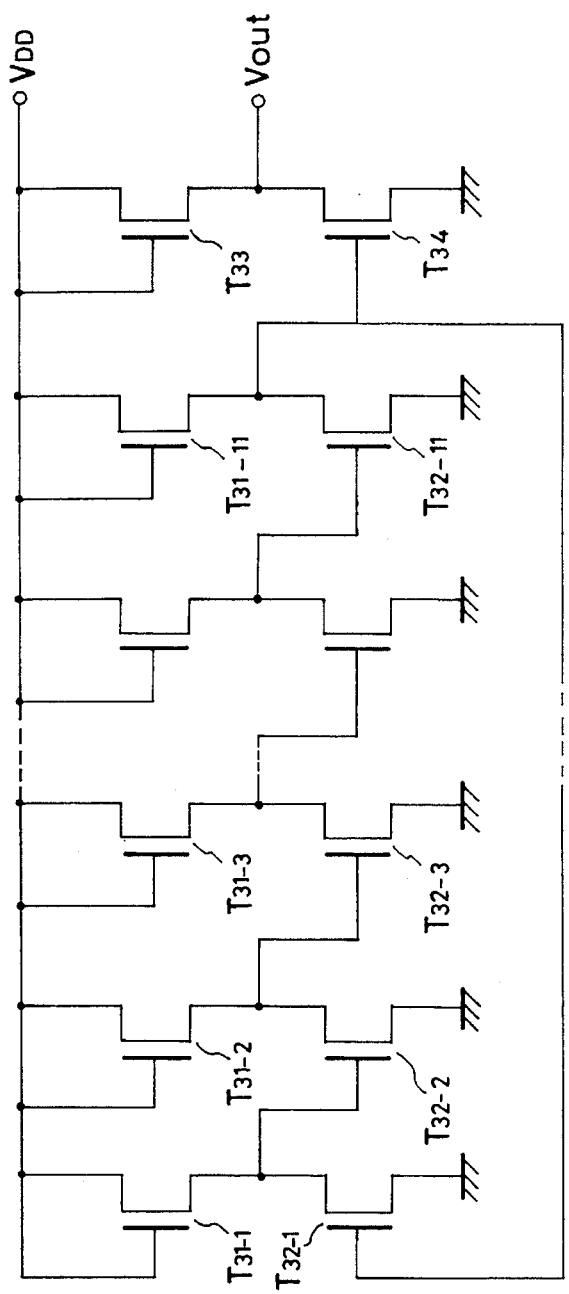
FIG. 13 is a circuit diagram of Example 6.
Figure 14:
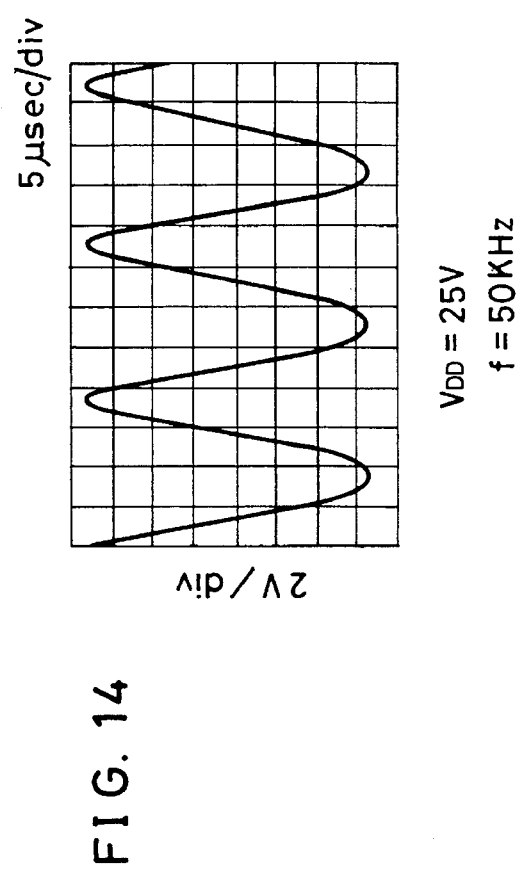
FIG. 14 is a chart of the oscillated waveform when Example 6 is actuated.

FIG. 13 is a circuit diagram of a 11-stage ring oscillator of this Example, and FIG. 14 is a chart showing the oscillated waveform when this Example is actuated.

This Example was prepared similarly as Example 5 by depositing a polycrystalline silicon thin film on Corning #7059 substrate, following otherwise the same stops A to F in FIG. 8. The source part, the drain part, the gate and the wiring part has the same structures as in Example 5.

The shape of the TFT, $T_{31-1}$,–$T_{31-11}$, was made to have W/L=150μ/20μ, while that of the TFT, $T_{32-1}$–$T_{32-11}$, was made to have W/L=1500μ/20μ. On the other hand, the buffer TFT, $T_{33}$ and $T_{34}$ were made to have shapes of W/L=150μ/20μ and 1500μ/20μ, respectively. Overlapping of the gate and the source and of the gate and the drain in TFT was made each 2.5μ.

The TFT unit prepared in this Example had an effective mobility of 5.0 cm$^2$/V.sec, and the ring oscillator constituted by the TFT exhibited an oscillated waveform of a well-formed sign wave as shown in FIG. 14. With $V_{DD}$=25 V, the signal of an oscillated frequency of 50 KHz could be taken out as $V_{out}$.

As described above, in this Example, a circuit constitution with small floating capacitance could be realized.

It is also desirable that the end of the contact layer should be formed in such a manner that the edge thereof is set back from the end of the semiconductor layer by at least a distance not less than the thickness of the insulating layer formed on said contact layer.

What we claim is:

1. A semiconductor device comprising a thin film transistor and a plurality of wiring parts, said thin film transistor and said wiring parts each having a multilayer structure comprising a semiconductor layer and a contact layer formed on said semiconductor layer, said semiconductor layer and said contact layer of said wiring parts having the same multilayer structure as formed continuously with a source region or a drain region, and the semiconductor layer of said wiring parts and the semiconductor layer of said thin film transistor being electrically isolated from each other at least in a region other than said wiring parts.

2. A semiconductor device according to claim 1, wherein the semiconductor layer comprises amorphous silicon.

3. A semiconductor device according to claim 1, wherein the contact layer comprises an n$^+$ layer.

4. A semiconductor device according to claim 1, wherein at least a part of the semiconductor layer constituting the semiconductor device is crystalline.

5. A semiconductor device according to claim 1, wherein at least a part of the semiconductor layer constituting the semiconductor device is polycrystalline.

6. A semiconductor device according to claim 1, further comprising an insulating layer on said source and drain regions, and wherein, said contact layer is formed to have an edge set back from an end of said semiconductor layer by at least a thickness of said insulating layer.

7. A semiconductor device comprising a thin film transistor and a plurality of wiring parts, said thin film transistor and said wiring parts each comprising a semiconductor layer and a contact layer formed on said semiconductor layer, said semiconductor layer and said contact layer of said wiring parts being formed continuously with a source region or a drain region, and there being no semiconductor layer extending from said wiring parts or said thin film transistor in a region other than said wiring parts and said thin film transistor, wherein the contact layer comprises an n$^+$ layer and a metallic layer.

8. A semiconductor device according to claim 16, wherein the semiconductor layer comprises amorphous silicon.

9. A semiconductor device according to claim 16, further comprising an insulating layer on the source and drain regions and wherein, the set back of the edge is at least a thickness of the insulating layer.

10. A semiconductor device comprising a thin film transistor and a plurality of wiring parts, said thin film transistor and said wiring parts each having a multilayer structure comprising a semiconductor layer and a contact layer formed on said semiconductor layer so as to have an edge set back from the end of said semiconductor, said semiconductor layer and said contact layer of said wiring parts having the same multilayer structure as formed continuously with a source region or a drain region, and different portions of said wiring parts being electrically isolated from each other.

11. A semiconductor device according to claim 10, wherein the semiconductor layer comprises amorphous silicon.

12. A semiconductor device according to claim 10, wherein the contact layer comprises an n$^+$ layer.

13. A semiconductor device according to claim 10, wherein at least a part of the semiconductor layer constituting the semiconductor device is crystalline.

14. A semiconductor device according to claim 10, wherein at least a part of the semiconductor layer constituting the semiconductor device is polycrystalline.

15. A semiconductor device according to claim 10, further comprising an insulating layer on the source and drain regions and wherein, the set back of the edge is at least a thickness of the insulating layer.

16. A semiconductor device comprising a thin film transistor and a plurality of wiring parts, said thin film transistor and said wiring parts each comprising a semiconductor layer and a contact layer formed on said semiconductor layer so as to have an edge set back from the end of said semiconductor, said semiconductor layer and said contact layer of said wiring parts being formed continuously with a source region or a drain region and extending to other elements of the semiconductor device, and different portions of said wiring parts being electrically isolated from each other, wherein the contact layer comprises an n$^+$ layer and a metallic layer.

17. A semiconductor device according to claim 7, wherein the semiconductor layer comprises amorphous silicon.

18. A semiconductor device according to claim 7, further comprising an insulating layer on said source and drain regions, and wherein, said contact layer is formed to have an edge set back from an end of said semiconductor layer by at least a thickness of said insulating layer.

19. A semiconductor device which comprises:

a thin film transistor having a semiconductor layer and multilayered source and drain regions provided in contact with said semiconductor layer; and internal wiring provided as electrically connected to a selected one of said source and drain regions of said thin film transistor and to other elements of the semiconductor device, said internal wiring having a portion adapted to receive external wiring, at least part of said internal wiring having the same multilayered structure as the selected one of said source and drain regions in contact with said semiconductor layer and being integral with the selected one of said source and drain regions, said source and drain regions and said part of said internal wiring being formed in such a manner that an edge thereof is set back from an edge of said semiconductor layer.

20. A semiconductor device according to claim 19, wherein at least a part of the semiconductor layer constituting the semiconductor device is crystalline.

21. A semiconductor device according to claim 19, wherein at least a part of the semiconductor layer constituting the semiconductor device is polycrystalline.

22. A semiconductor device according to claim 19, wherein at least a part of the semiconductor layer constituting the semiconductor device is amorphous.

23. A semiconductor device according to claim 19, wherein at least a part of the semiconductor layer constituting the semiconductor device is comprised of silicon.

24. A semiconductor device according to claim 19, wherein said device has an insulating layer provided over said thin film transistor and said internal wiring, and the length of set back is at least the thickness of said insulating layer.

25. A semiconductor device which comprises:

a thin film transistor having a semiconductor layer, multilayered source and drain regions provided on said semiconductor layer, and a gate electrode provided on said source and drain regions with an insulating layer interposed therebetween; and a wiring formed continued from a selected one of said source and drain regions of said thin film transistor to at least other elements of the semiconductor device, at least part of said wiring having the same multilayered structure as the selected one of said source and drain regions in contact with said semiconductor layer, and said source and drain regions and said part of said wiring being formed in such a manner that an edge thereof is set back from an edge of said semiconductor layer.

26. A semiconductor device according to claim 25, wherein at least a part of the semiconductor layer constituting the semiconductor device is crystalline.

27. A semiconductor device according to claim 25, wherein at least a part of the semiconductor layer constituting the semiconductor device is polycrystalline.

28. A semiconductor device according to claim 25, wherein at least a part of the semiconductor layer constituting the semiconductor device is amorphous.

29. A semiconductor device according to claim 25, wherein at least a part of the semiconductor layer constituting the semiconductor device is comprised of silicon.

30. A semiconductor device according to claim 25, wherein the length of set back is at least the thickness of said insulating layer.

31. A semiconductor device according to claim 25 wherein said same multilayered structure is constituted of said semiconductor layer, an $n^+$-layer provided on said semiconductor layer and an electroconductive layer provided on the $n^+$-layer.

32. A semiconductor device according to claim 31, wherein the length of set back is at least the thickness of said insulating layer.

33. A semiconductor device according to claim 31, wherein the edges of said $n^+$-layer and said electroconductive layer are substantially even.

34. A semiconductor device which comprises:

a substrate;

a thin film transistor formed on said substrate, said transistor having a semiconductor layer provided on said substrate, a source region provided on said semiconductor layer having an n+ layer and a conductive layer, a drain region provided on said semiconductor layer having an n+ layer and a conductive layer, an insulating layer provided on said source and drain regions, and a gate electrode provided on said insulating layer at least between said source and drain regions; and internal wiring formed continued from at least one of said source and drain regions to at least other elements of the semiconductor device and having a semiconductor layer, an n+ layer provided on said semiconductor layer and a conductive layer provided on said n+ layer, said internal wiring having a portion adapted to receive external wiring, said n+ layer of the internal wiring and said conductive layer of the internal wiring being formed in such a manner that an edge thereof is set back from an edge of said semiconductor layer.

35. A semiconductor device according to claim 34, wherein said device has an insulating layer provided over said thin film transistor and said internal wiring, and the set back is at least a thickness of said insulating layer.

* * * * *

UNITED STATES PATENT AND TRADEMARK OFFICE
CERTIFICATE OF CORRECTION

PATENT NO. : 5,485,020

DATED : January 16, 1996

INVENTORS : YUTAKA HIRAI ET AL.

It is certified that error appears in the above-identified patent and that said Letters Patent is hereby corrected as shown below:

ON TITLE PAGE

AT [56] References Cited

U.S. Patent Documents, "4,047,824 11/1977 Woods" should read --4,057,824 11/1977 Woods--.

SHEET 9 of 12

FIG. 10 "STAG" should read --STAGE--.

COLUMN 1

Line 34, "sapphire" should read --the sapphire--.

COLUMN 2

Line 28, "leak." should read --leaks.--.

UNITED STATES PATENT AND TRADEMARK OFFICE
CERTIFICATE OF CORRECTION

PATENT NO. : 5,485,020

DATED : January 16, 1996

INVENTORS : YUTAKA HIRAI ET AL.

It is certified that error appears in the above-identified patent and that said Letters Patent is hereby corrected as shown below:

COLUMN 3

Line 17, "schematic" should read --are schematic-- and "view" should read --views--;

Line 34, "schematic illustration" should read --are schematic illustrations--;

Line 36, "A through F," should read --of Figs. 8A through 8F,--.

COLUMN 4

Line 5, "region," should read --region--;
    Line 15, "short" should read --short,--.

COLUMN 6

Line 16, "TFT $Q_{14}$ $Q_{15}$" should read --$Q_{14}$, $Q_{15}$--;
    Line 54, "are" (second occurrance) should be deleted.

COLUMN 7

Line 27, "leak" should read --leaks--;
    Line 34, "The step" should be deleted.

COLUMN 8

Line 49, "region" should read --regions--.

UNITED STATES PATENT AND TRADEMARK OFFICE
CERTIFICATE OF CORRECTION

PATENT NO. : 5,485,020

DATED : January 16, 1996

INVENTORS : YUTAKA HIRAI ET AL.

It is certified that error appears in the above-identified patent and that said Letters Patent is hereby corrected as shown below:

COLUMN 9

Line 18,   "stops A" should read --steps A--;
    Line 20,   "has" should read --have--;
    Line 31,   "sign" should read --sine--.

COLUMN 10

Line 15,   "8." should read --17--;
    Line 17,   "9." should read --18.--;
    Line 61,   "17." should read --8.--;
    Line 63,   "18." should read --9.--;

COLUMN 12

Line 13,   "claim 25" should read --claim 25,--.

Signed and Sealed this

Twenty-seventh Day of August, 1996

Attest:

BRUCE LEHMAN

*Attesting Officer*      *Commissioner of Patents and Trademarks*